(12) United States Patent
Furumura et al.

(10) Patent No.: US 8,686,743 B2
(45) Date of Patent: Apr. 1, 2014

(54) SUBSTRATE, SUBSTRATE HOLDING APPARATUS, ANALYSIS APPARATUS, PROGRAM, DETECTION SYSTEM, SEMICONDUCTOR DEVICE, DISPLAY APPARATUS, AND SEMICONDUCTOR MANUFACTURING APPARATUS

(75) Inventors: Yuji Furumura, Kanagawa (JP); Naomi Mura, Tokyo (JP); Koki Tamagawa, Nagano (JP); Tadayoshi Yoshikawa, Nagano (JP); Hiroshi Yonekura, Nagano (JP)

(73) Assignees: Philtech Inc., Bunkyou-Ku (JP); Shinko Electric Industries Co., Ltd., Nagano (JP)

( * ) Notice: Subject to any disclaimer, the term of this patent is extended or adjusted under 35 U.S.C. 154(b) by 531 days.

(21) Appl. No.: 12/592,219

(22) Filed: Nov. 19, 2009

(65) Prior Publication Data
US 2010/0134122 A1 Jun. 3, 2010

(30) Foreign Application Priority Data
Dec. 2, 2008 (JP) ................................ 2008-307823

(51) Int. Cl.
*G01R 27/28* (2006.01)
(52) U.S. Cl.
USPC ............................ 324/655; 324/652; 324/682
(58) Field of Classification Search
None
See application file for complete search history.

(56) References Cited

U.S. PATENT DOCUMENTS

| 5,466,614 | A | | 11/1995 | Yakura et al. |
| 5,731,697 | A | * | 3/1998 | Li et al. ........................ 324/71.5 |
| 6,111,520 | A | * | 8/2000 | Allen et al. ............... 340/870.16 |
| 6,278,379 | B1 | * | 8/2001 | Allen et al. ............... 340/870.16 |
| 6,340,932 | B1 | * | 1/2002 | Rodgers et al. ............ 340/572.7 |
| 6,773,158 | B2 | * | 8/2004 | Koshimizu .................... 374/117 |
| 6,891,380 | B2 | * | 5/2005 | Kesil et al. .................... 324/635 |
| 2003/0012255 | A1 | * | 1/2003 | Koshimizu .................... 374/117 |
| 2004/0239504 | A1 | | 12/2004 | Kalinin et al. |

FOREIGN PATENT DOCUMENTS

| JP | H07106392 | A | 4/1995 |
| JP | 2002-520587 | | 7/2002 |
| JP | 2004-144683 | A | 5/2004 |
| JP | 2005-501235 | A | 1/2005 |
| JP | 2007-661110 | | 3/2007 |
| JP | 2007-171047 | A | 7/2007 |
| JP | 2007-273947 | A | 10/2007 |
| JP | 2007-536726 | | 12/2007 |

* cited by examiner

*Primary Examiner* — Minh N Tang
(74) *Attorney, Agent, or Firm* — Edwards Wildman Palmer LLP; Jeffrey D. Hsi; Jonathan P. Western

(57) ABSTRACT

A substrate including a sensor unit, wherein the sensor unit includes a coil wound at least once arranged on the surface of the sensor or embedded within and near the surface thereof. With such an arrangement, an electric current that corresponds to information with respect to the substrate (e.g., the temperature of the substrate or the amount of charge stored in the substrate) flows through the coil.

14 Claims, 10 Drawing Sheets

SUBSTRATE, SUBSTRATE HOLDING APPARATUS, ANALYSIS APPARATUS, PROGRAM, DETECTION SYSTEM, SEMICONDUCTOR DEVICE, DISPLAY APPARATUS, AND SEMICONDUCTOR MANUFACTURING APPARATUS

This application is based on and claims priority from Japanese Patent Application No. 2008-307823, filed on Dec. 2, 2008, the content of which is incorporated herein by reference.

BACKGROUND OF THE INVENTION

1. Field of the Invention

The present invention relates to a substrate, a substrate holding apparatus, an analysis apparatus, a program, a detection system, a semiconductor device, a display apparatus, and a semiconductor manufacturing apparatus, which are capable of analyzing information such as the temperature of a substrate.

2. Description of the Related Art

In conventional film deposition apparatuses which deposit a film on a substrate such as a glass substrate, wafer, or the like, and manufacturing apparatuses such as an etching apparatus for patterning a film deposited on a substrate, it is essential to analyze and control the temperature of the substrate.

Accordingly, apparatuses have been proposed in which a temperature sensor is provided on a wafer, and the temperature of the wafer is measured using the temperature sensor (see PCT Japanese Translation Patent Publication No. 2007-536726 and PCT Japanese Translation Patent Publication No. 2002-520587, for example).

With the apparatus described in PCT Japanese Translation Patent Publication No. 2007-536726, the information with respect to the wafer temperature measured by the temperature sensor is stored in a storage means. Thus, such an apparatus is capable of analyzing the wafer temperature measured by the temperature sensor by reading out the information thus stored in the storage means.

With the apparatus described in PCT Japanese Translation Patent Publication No. 2002-520587, the temperature sensor is connected to a computer via an optical cable. Thus, the wafer temperature measured by the temperature sensor can be analyzed by means of the computer.

In the apparatus described in PCT Japanese Translation Patent Publication No. 2007-536726, the temperature sensor and the storage means are arranged as a single unit. Accordingly, the upper limit of the wafer temperature which can be measured by the apparatus described in PCT Japanese Translation Patent Publication No. 2007-536726 is limited to around 145° C. which is the upper limit of the operable temperature range of the storage means. This leads to a problem in that such an apparatus cannot be used in an environment in which the wafer reaches a high temperature.

On the other hand, with the apparatus described in PCT Japanese Translation Patent Publication No. 2002-520587, the temperature sensor provided to a wafer is physically connected to a computer via an optical cable. Accordingly, in some cases, the optical cable can interfere with the wafer process provided by a manufacturing apparatus such as the aforementioned film deposition apparatus etc., leading to reduction in the degree of freedom of the manufacturing process for a wafer.

SUMMARY OF THE INVENTION

Accordingly, the present invention has been made in view of the aforementioned situation. It is an object of the present invention to provide a substrate, a substrate holding apparatus, an analysis apparatus, a program, a detection system, a semiconductor device, a display apparatus, and a semiconductor manufacturing apparatus, which are capable of detecting or analyzing information such as the temperature of the substrate, and which can operate without reduction in the degree of freedom of the manufacturing process for the substrate even in an environment in which the substrate reaches a high temperature.

For purposes of summarizing the invention, certain aspects of the invention have been described herein. It is to be expressly understood that it is not intended as a definition of the limits of the invention.

In order to solve the aforementioned problems, the present invention proposes the following arrangements.

An aspect of the present invention relates to a substrate. A substrate including a sensor unit, wherein the sensor unit includes a coil wound at least once arranged on the surface of the sensor or embedded within and near the surface thereof. With such an arrangement, an electric current that corresponds to information with respect to the substrate (e.g., the temperature of the substrate or the amount of charge stored in the substrate) flows through the coil.

Another aspect of the present invention also relates to a substrate. A substrate including a sensor unit, wherein the sensor unit includes: an SAW resonator; and an antenna unit electrically connected to the SAW resonator. In the sensor unit, the electric current, which corresponds to the information with respect to the substrate (e.g., the temperature of the substrate or the amount of charge stored in the substrate) and the direction of which changes according to the resonance frequency of the SAW resonator, flows through the antenna unit.

These and other aspects of the invention will become apparent from the following description of the preferred embodiments taken in conjunction with the following drawings.

DETAILED DESCRIPTION OF THE INVENTION

Detailed description will be made below regarding embodiments of the present invention with reference to the drawings.

First Embodiment

Figure 1:
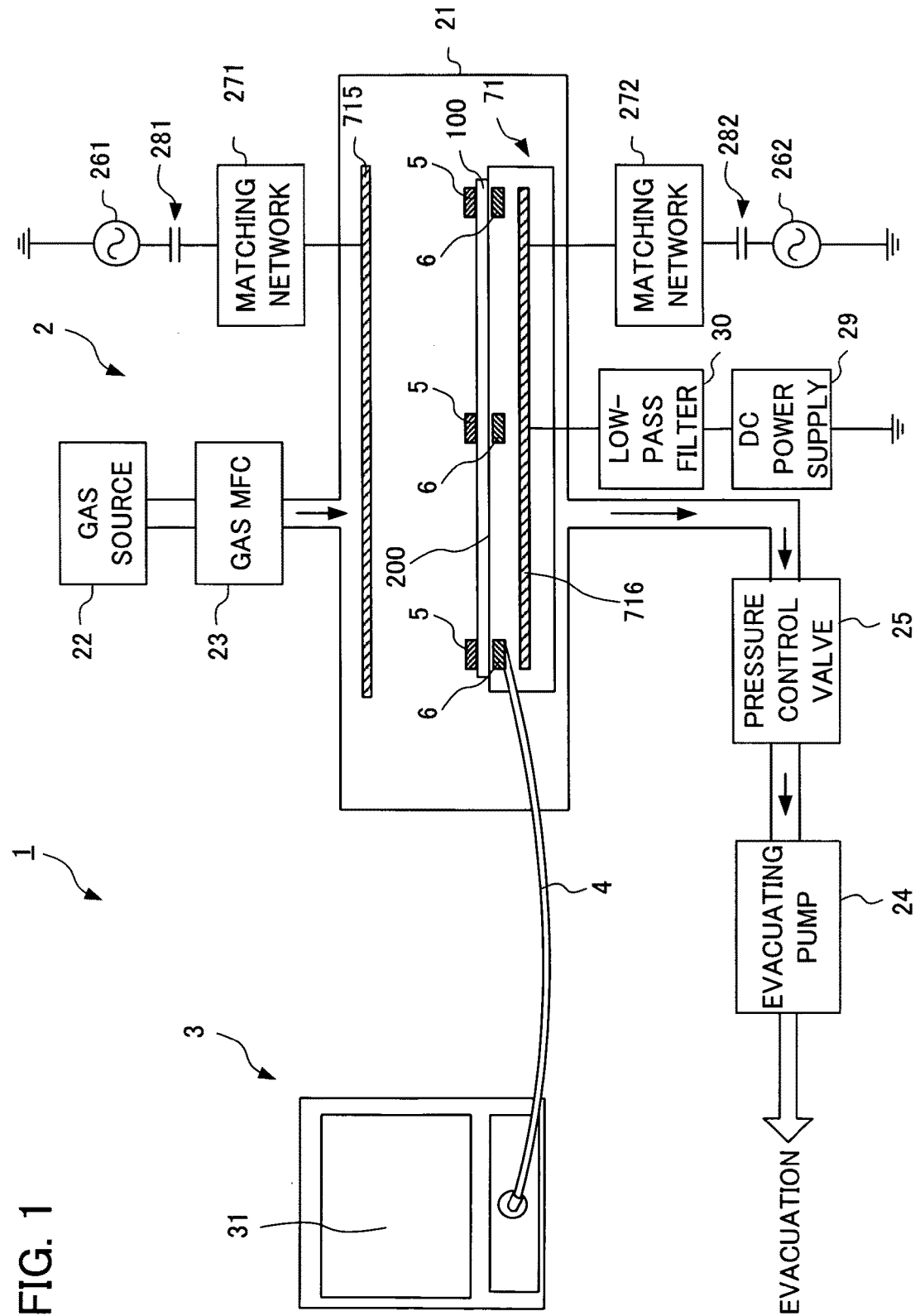
FIG. 1 is a diagram which shows a configuration of a semiconductor manufacturing system according to a first embodiment of the present invention.

FIG. 1 is a diagram which shows a configuration of a semiconductor manufacturing system 1 according to a first embodiment of the present invention. The semiconductor manufacturing system 1 includes a semiconductor manufacturing apparatus 2 and an analysis apparatus 3.

The semiconductor manufacturing apparatus 2 uses plasma to etch a wafer 100. The semiconductor manufacturing apparatus 2 includes a plasma chamber 21, a gas source 22, a gas mass flow controller (gas MFC) 23, an evacuating pump 24, a pressure control valve 25, power supplies 261 and 262, matching networks 271 and 272, and coupling capacitors 281 and 282.

The gas source 22 supplies etching gas to the plasma chamber 21. The gas MFC 23 controls the amount of etching gas supplied from the gas source 22 to the plasma chamber 21.

The evacuating pump 24 evacuates the gas in the plasma chamber 21 to the exterior. The pressure control valve 25 controls the amount of gas evacuated to the exterior by the evacuating pump 24 from the plasma chamber 21.

The plasma chamber 21 includes an electrode 715 and an electrostatic chuck 71 having an electrostatic attraction electrode 716 facing the electrode 715. The electrode 715 is electrically connected to the power supply 261 via the matching network 271 and the coupling capacitor 281. The electrostatic attraction electrode 716 is electrically connected to the power supply 262 via the matching network 272 and the coupling capacitor 282, and is electrically connected to a direct current power supply (DC power supply) 29 via a low-pass filter 30.

The power supply 261 applies a voltage having a first frequency component to the electrode 715. The power supply 262 applies a voltage having a second frequency component to the electrostatic attraction electrode 716. The matching network 271 performs impedance matching between the power supply 261 and the plasma generated in the plasma chamber 21. The matching network 272 performs impedance matching between the power supply 262 and the plasma generated in the plasma chamber 21.

The DC power supply 29 applies voltage to the electrostatic attraction electrode 716 via the low-pass filter 30 so as to electrostatically attract the wafer 100.

The electrostatic chuck 71 is provided to a substrate holding apparatus 7 described later. The electrostatic chuck 71 holds the wafer 100 on a mounting surface 200, which is the surface that faces the electrode 715, by means of the electrostatic attraction provided by the aforementioned electrostatic attraction electrode 716. Multiple resonators 5 are mounted on the surface of the wafer 100 that faces the electrode 715. Furthermore, the electrostatic chuck 71 includes multiple probe coils 6 in addition to the aforementioned electrostatic attraction electrode 716. The multiple probe coils 6 are arranged facing the multiple resonators 5 with the mounting surface 200 interposed between them.

Figure 2:
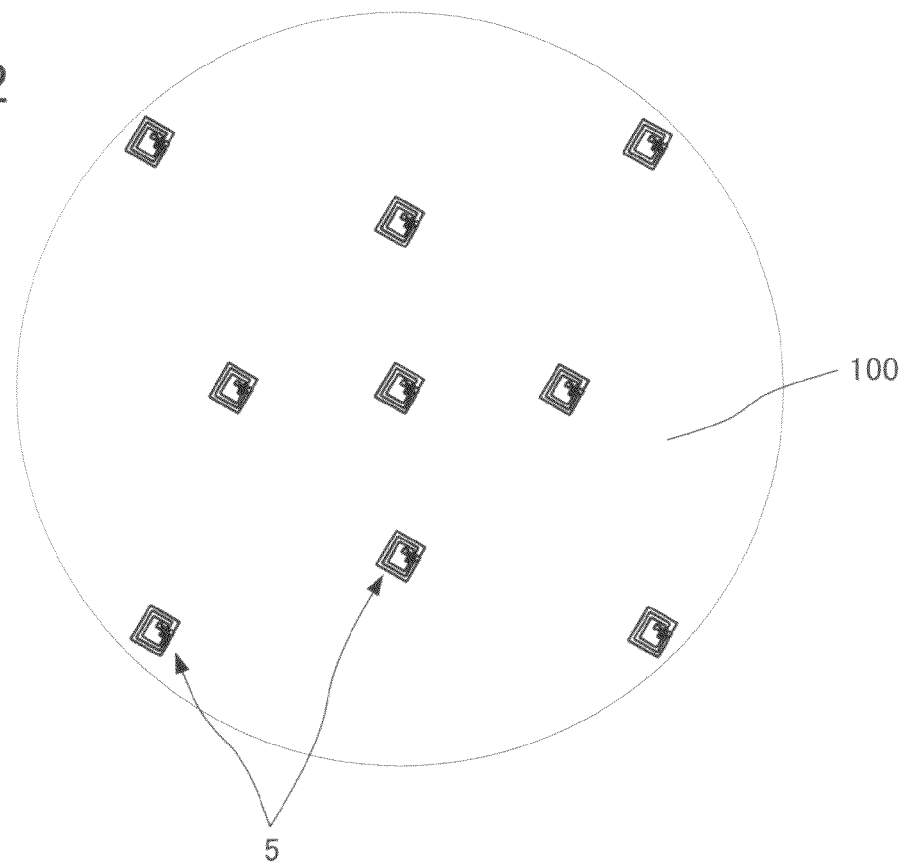
FIG. 2 is a front view of a wafer to be manufactured by the semiconductor manufacturing system.

FIG. 2 is a front view of the wafer 100. The wafer 100 is formed in a circular shape as seen from a planar view, and mounts nine resonators 5.

Figure 3:
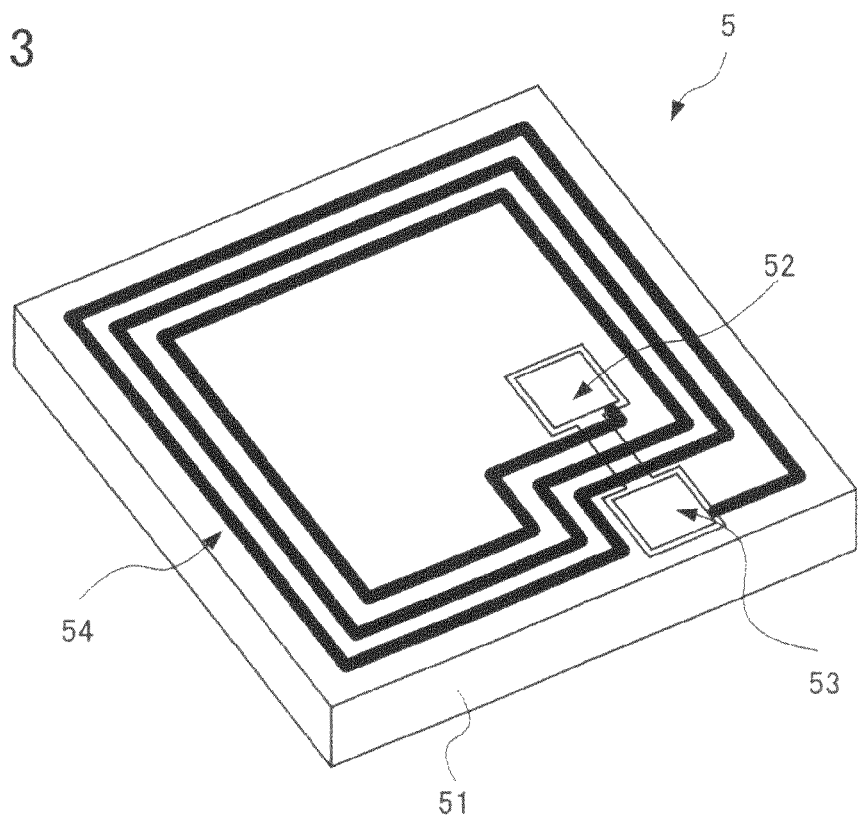
FIG. 3 is a perspective view of a resonator mounted on the wafer.

FIG. 3 is a perspective view of the resonator 5. The resonator 5 includes a base 51 formed in a rectangular shape as seen from a planar view, capacitors 52 and 53 and an inductor 54 formed on the surface of the base 51 or within and near the surface of the base 51. Each of the capacitors 52 and 53 is a so-called MIM (Metal-Insulator-Metal) capacitor, and is formed in the vicinity of the edge of the base 51. The inductor 54 is a coil in the form of a spiral wound approximately three times, and is formed along the edge of the base 51.

Figure 4:
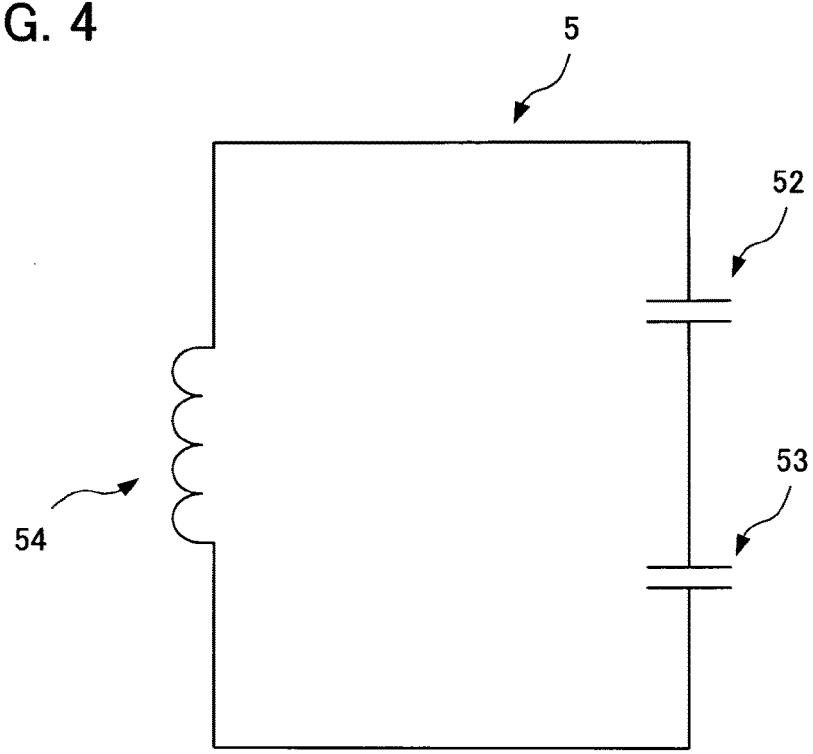
FIG. 4 is an equivalent circuit diagram for the resonator.

FIG. 4 is an equivalent circuit diagram which shows the resonator 5. One terminal side of the inductor 54 is connected to one electrode of the capacitor 52. The other terminal side of the inductor 54 is connected to one electrode of the capacitor 53. The other electrode of the capacitor 52 is connected to the other electrode of the capacitor 53. That is to say, the capacitors 52 and 53 and the inductor 54 are connected in series, forming a closed circuit. Accordingly, the resonator 5 including the capacitors 52 and 53 and the inductor 54 forms a so-called LC tank circuit.

With the capacitance of the capacitor 52 as $C_1$, with the capacitance of the capacitor 53 as $C_2$, with the self-inductance of the inductor 54 as L, and with the sum total of the resistance components of the capacitors 52 and 53 and the inductor 54 as R, the impedance Z of the resonator 5 is represented by the following Expression (1).

[Expression 1]

$$Z = \sqrt{R^2 + \left(\omega L - \frac{C_1 + C_2}{\omega C_1 C_2}\right)^2} \quad (1)$$

In Expression (1), when the impedance Z of the resonator 5 is the minimum value, i.e., when the term in Expression (1) represented by the following Expression (2) is zero, the current that flows through the resonator 5 exhibits the maximum value. The angular frequency at this point is referred to as the "resonance angular frequency". With the resonance angular frequency as $\omega_0$, the resonance angular frequency $\omega_0$ of the resonator 5 is represented by the following Expression (3).

[Expression 2]

$$\omega L - \frac{C_1 + C_2}{\omega C_1 C_2} \quad (2)$$

[Expression 3]

$$\omega_0 = \sqrt{\frac{C_1 + C_2}{L C_1 C_2}} \quad (3)$$

The resonance frequency $f_0$ of the resonator 5 is represented by the following Expression (4) using the resonance angular frequency $\omega_0$ of the resonator 5 represented by Expression (3).

[Expression 4]

$$f_0 = \frac{\omega_0}{2\pi} \qquad (4)$$
$$= \frac{1}{2\pi}\sqrt{\frac{C_1 + C_2}{LC_1 C_2}}$$

With such an arrangement, the capacitance $C_1$ of the capacitor 52 changes according to the temperature of the capacitor 52. Furthermore, the capacitance $C_2$ of the capacitor 53 changes according to the temperature of the capacitor 53. Moreover, the self-inductance L of the inductor 54 changes according to the temperature of the inductor 54. Accordingly, the resonance frequency $f_0$ of the resonator 5 represented by Expression (4) changes according to the temperatures of the capacitors 52 and 53 and the inductor 54. With such an arrangement, each resonator 5 is mounted on the wafer 100. Accordingly, the temperatures of the capacitors 52 and 53 and the inductor 54 are approximately the same as the temperature of the wafer 100. As a result, the resonance frequency $f_0$ of the resonator 5 changes according to the temperature of the wafer 100.

Figure 5:
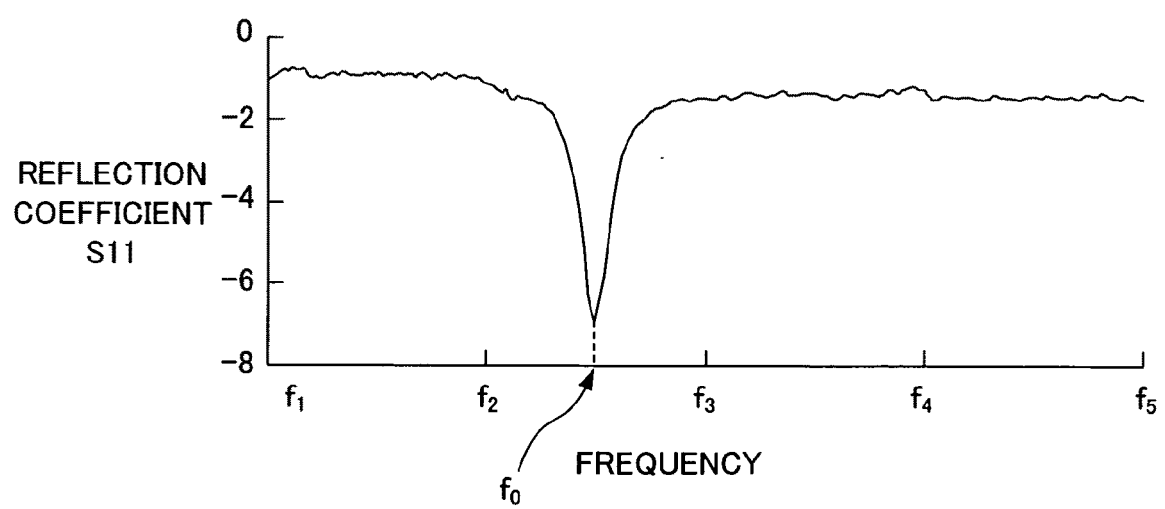
FIG. 5 is a diagram which shows the frequency properties of the resonator.

FIG. 5 is a diagram which shows the frequency properties of the resonator 5. In FIG. 5, the vertical axis represents the reflection coefficient S11, and the horizontal axis represents the frequency. As can be understood from FIG. 5, when the frequency of the resonator 5 is equal to the resonance frequency $f_0$, the reflection coefficient exhibits the minimum value.

Figure 6:
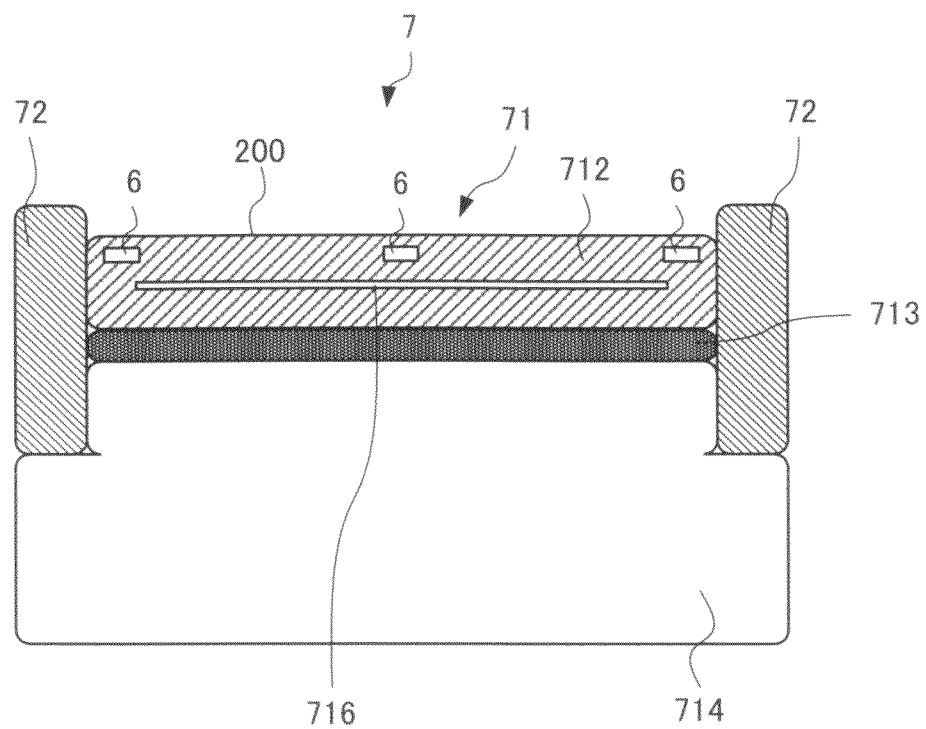
FIG. 6 is a cross-sectional view of a substrate holding apparatus included in the semiconductor manufacturing system.

FIG. 6 is a cross-sectional view of the substrate holding apparatus 7. The substrate holding apparatus 7 includes a quartz ring 72 formed of quartz, in addition to the aforementioned electrostatic chuck 71. The electrostatic chuck 71 includes a ceramic plate 712 which serves as a base member, an adhesion layer 713, and a base 714.

The ceramic plate 712 is formed of a ceramic material in a circular form as seen from a planar view. The aforementioned electrostatic attraction electrode 716 and the probe coils 6 are embedded within the ceramic plate 712. The ceramic plate 712 is bonded to the base 714 via the adhesion layer 713.

Figure 7:
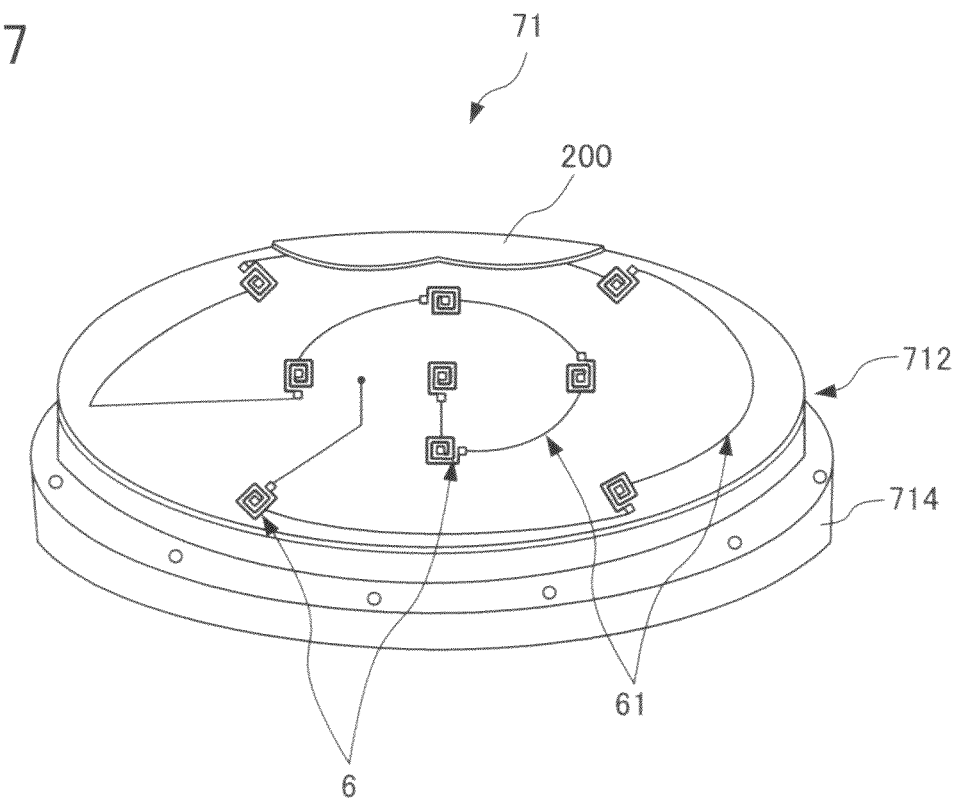
FIG. 7 is a perspective view of an electrostatic chuck included in the substrate holding apparatus.

Each probe coil 6 is embedded within the ceramic plate 712 such that it is positioned above the electrostatic attraction electrode 716, i.e., on the mounting surface 200 side of the wafer 100 relative to the electrostatic attraction electrode 716. As shown in FIG. 7, the probe coils 6 are respectively provided at positions facing the nine resonators 5 shown in FIG. 2 with the mounting surface 200 interposed between them. That is to say, a total of nine probe coils 6 are provided immediately below the resonators 5 in a one-to-one manner. The nine probe coils 6 are connected in series by wiring 61.

Figure 8:
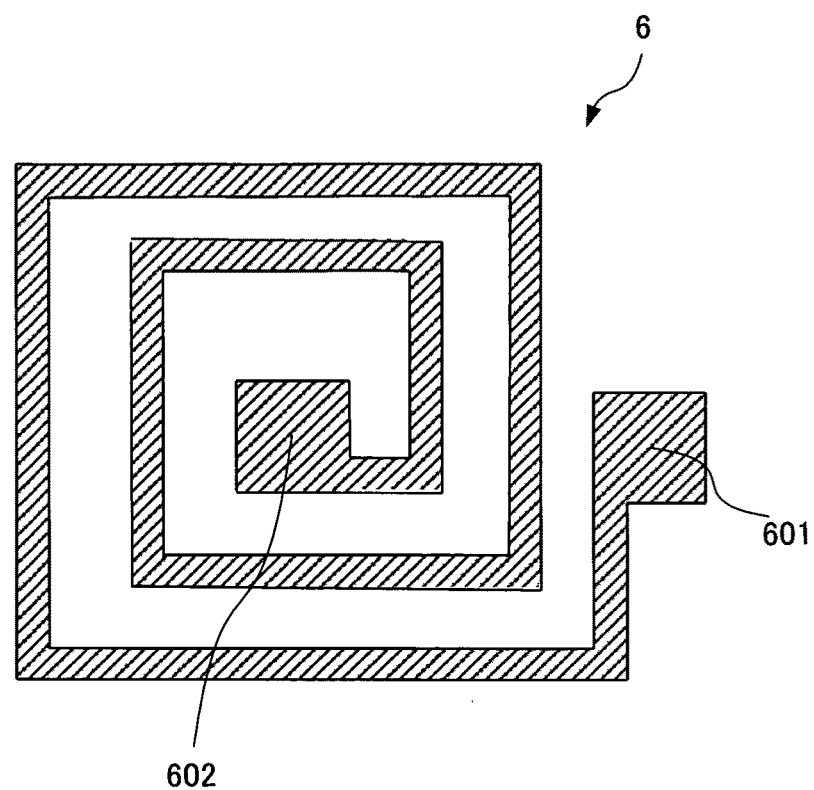
FIG. 8 is a front view of a probe coil included in the electrostatic chuck.

FIG. 8 is a front view of the probe coil 6. The probe coil 6 is a coil in the form of a spiral wound approximately 2.5 times. With one terminal of the probe coil 6 as a terminal 601, and with the other terminal thereof as a terminal 602, the terminal 601 of a probe coil 6 is electrically connected to the terminal 602 of a different probe coil 6 via the wiring 61.

Returning to FIG. 6, the quartz ring 72 is provided in the form of a ring along the edges of the ceramic plate 712, the adhesion layer 713, and a part of the base 714.

Returning to FIG. 1, the analysis apparatus 3 includes a display screen 31 for displaying an image, and is electrically connected to the nine probe coils 6 via an RF cable 4.

The semiconductor manufacturing apparatus 2 described above analyzes the temperature of the wafer 100 as follows. As described above, the nine resonators 5 are mounted on the wafer 100. The resonance frequency $f_0$ of each resonator 5 changes according to the temperature of the wafer 100.

In the state in which the wafer 100 is held on the mounting surface 200 by the electrostatic chuck 71, the nine inductors 54 included in the nine resonators 5 mounted on the wafer 100 are arranged facing the nine probe coils 6 with the mounting surface 200 interposed between them. Accordingly, each of the nine inductors 54 is magnetically coupled with a corresponding one of the nine probe coils 6, which is positioned facing the inductor 54 with the mounting surface 200 interposed between them. Accordingly, when electric current flows through the inductor 54, a magnetic field is generated around the inductor 54 according to the current value. The electromagnetic induction that occurs due to the magnetic field generates, at the probe coil 6 facing the inductor 54 with the mounting surface 200 interposed between them, the electromotive force according to the magnitude of the magnetic field.

With such an arrangement, the direction of the electric current that flows through the inductor 54 changes according to the resonance frequency $f_0$ of the resonator 5. Accordingly, the direction of the magnetic field generated around the inductor 54 also changes according to the resonance frequency $f_0$ of the resonator 5. As a result, the direction of the electromotive force generated at the probe coil 6 changes according to the resonance frequency $f_0$ of the resonator 5. The electromotive force thus generated at the probe coil 6 is supplied to the analysis apparatus 3.

As described above, the analysis apparatus 3 receives, from each probe coil 6, the electromotive force, the direction of which changes according to the resonance frequency $f_0$ of the corresponding resonator 5. With such an arrangement, the resonance frequency $f_0$ of each resonator 5 changes according to the temperature of the wafer 100. Thus, the analysis apparatus 3 is capable of analyzing the temperature of the wafer 100 based upon the frequency of the changes in the direction of the electromotive force supplied from the probe coil 6.

Specifically, the analysis apparatus 3 holds the correspondence information which represents the relation between the temperature of the wafer 100 and the resonance frequency $f_0$ of the resonator 5 mounted on the wafer 100. Upon receiving the electromotive force generated at the probe coil 6, the analysis apparatus 3 calculates the frequency of the changes in the direction of the electromotive force thus received, and obtains the temperature of the wafer at the positions at which the nine resonators are mounted, based upon the correspondence information thus held by the analysis apparatus 3. Furthermore, the analysis apparatus 3 analyzes the temperature of the entire surface of the wafer 100 based upon the temperatures at the nine positions on the wafer 100 thus obtained.

Figure 9:
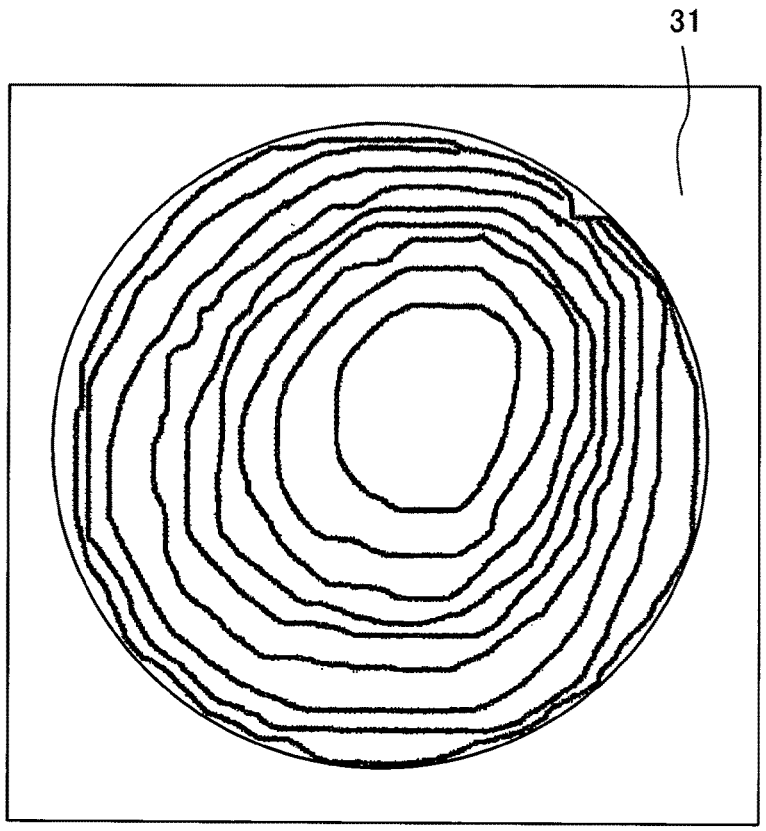
FIG. 9 is a diagram which shows analysis results of the temperature of the entire surface of the wafer.
Figure 10:
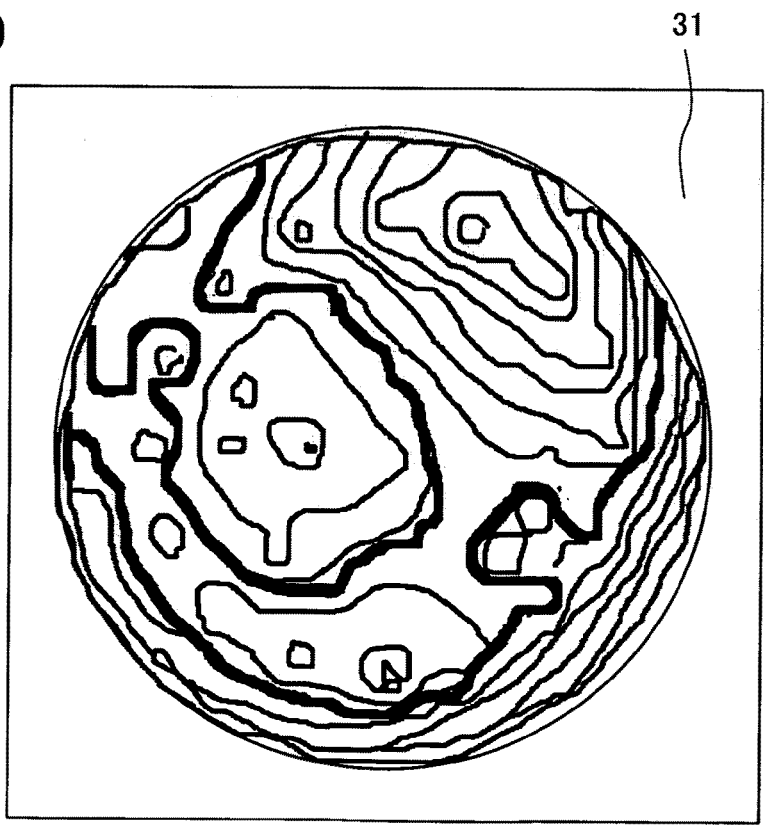
FIG. 10 is a diagram which shows analysis results of the temperature of the entire surface of the wafer.

FIG. 9 is a diagram which shows a first example of a display image displayed on the display screen 31 included in the analysis apparatus 3. FIG. 10 is a diagram which shows a second example of the display image displayed on the display screen 31 included in the analysis apparatus 3. As shown in FIG. 9 and FIG. 10, the display screen 31 displays the analysis results of the temperature of the entire surface of the wafer 100 as temperature contour lines.

With the semiconductor manufacturing system 1 described above, in the state in which the wafer 100 is held on the mounting surface 200 by means of the electrostatic chuck 71, the temperature of the wafer 100 can be analyzed without the need to physically connect each resonator 5 mounted on the wafer 100 to the analysis apparatus 3. Thus, such an arrangement is capable of analyzing the temperature of the wafer 100 without involving a reduction in the degree of freedom of the manufacturing process for the wafer 100.

Each resonator 5 mounted on the wafer 100 is configured as an LC tank circuit formed of the capacitors 52 and 53 and the inductor 54. Accordingly, the resonator 5 has a configuration including passive elements. Thus, such an arrangement raises the upper limit of the operable temperature range of the resonator 5, as compared with the upper limit of the operable temperature range of a resonator having a configuration including an active element. Thus, such an arrangement is capable of analyzing the temperature of the wafer 100 using the resonator 5 even in an environment in which the wafer 100 reaches a high temperature.

Second Embodiment

Figure 11:
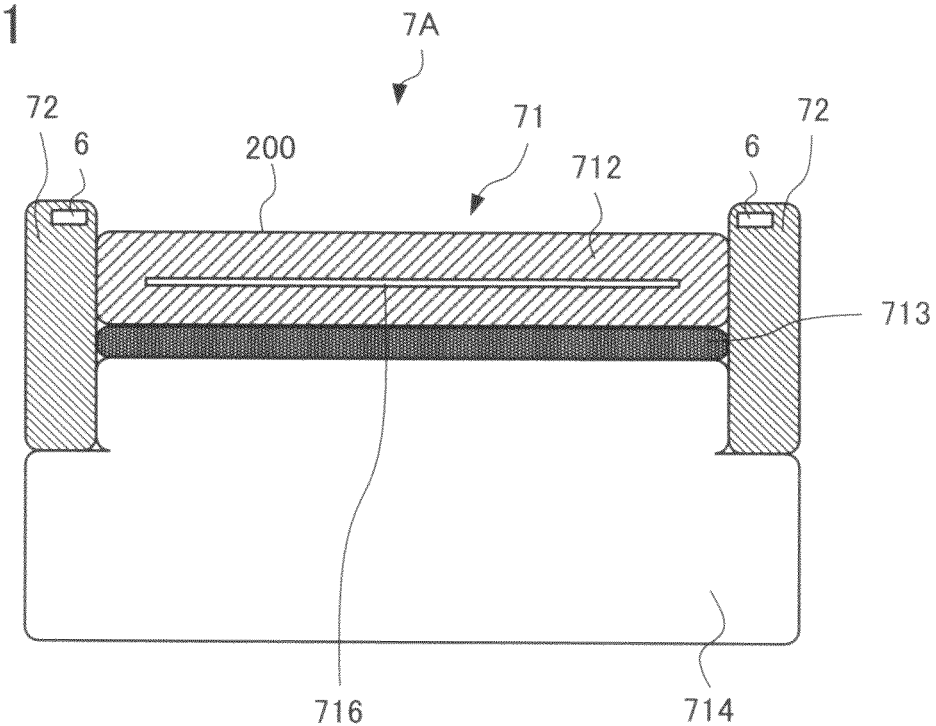
FIG. 11 is a cross-sectional view of a substrate holding apparatus according to a second embodiment of the present invention.

FIG. 11 is a cross-sectional view of a substrate holding apparatus 7A according to a second embodiment of the present invention. The difference between the substrate holding apparatus 7A and the substrate holding apparatus 7 according to the first embodiment of the present invention shown in FIG. 6 is that the probe coils 6 are arranged at different positions. The other configuration of the substrate holding apparatus 7A is the same as that of the first embodiment of the present invention, and accordingly, description thereof will be omitted.

In the substrate holding apparatus 7A, each probe coil 6 is embedded within the quartz ring 72. With such an arrangement, multiple probe coils 6 may be embedded within the quartz ring 72. Also, a single coil 6 may be embedded in the form of a ring within and along the inner edge of the quartz ring 72.

A semiconductor manufacturing system including the substrate holding apparatus 7A provides the same advantages as those of the semiconductor manufacturing system 1 according to the first embodiment of the present invention.

Third Embodiment

Figure 12:
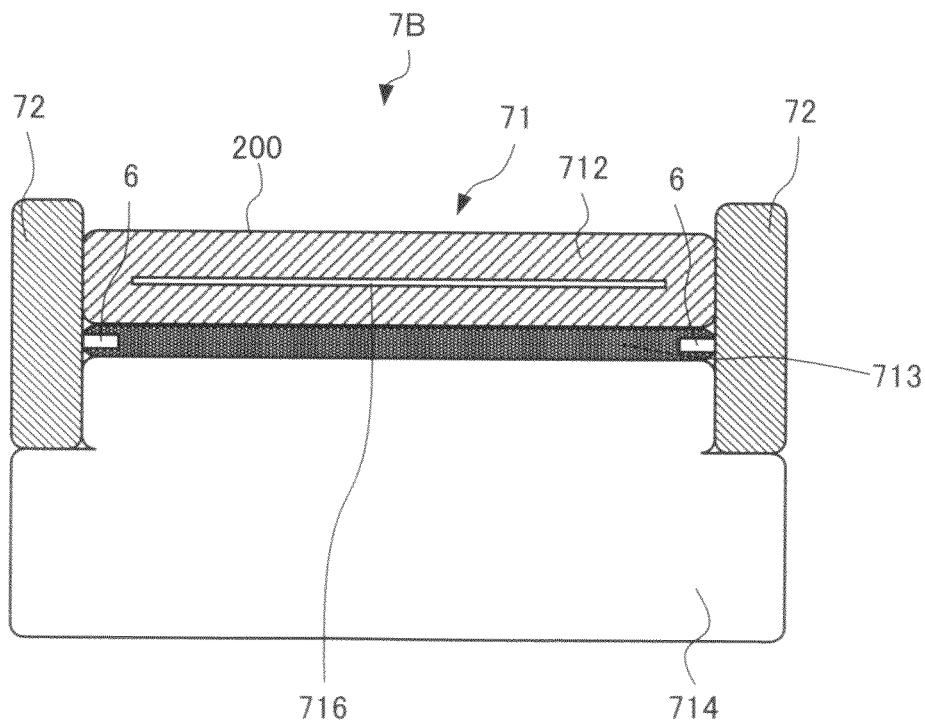
FIG. 12 is a cross-sectional view of a substrate holding apparatus according to a third embodiment of the present invention.

FIG. 12 is a cross-sectional view of a substrate holding apparatus 7B according to a third embodiment of the present invention. The difference between the substrate holding apparatus 7B and the substrate holding apparatus 7 according to the first embodiment of the present invention shown in FIG. 6 or the substrate holding apparatus 7A according to the second embodiment of the present invention shown in FIG. 11 is that the probe coils 6 are arranged at different positions. The other configuration of the substrate holding apparatus 7A is the same as that of the first embodiment of the present invention, and accordingly, description thereof will be omitted.

In the substrate holding apparatus 7B, each probe coil 6 is embedded within the adhesion layer 713. With such an arrangement, multiple probe coils 6 may be embedded within the adhesion layer 713. Also, a single coil 6 may be embedded therewithin along the edge thereof in the form of a ring.

A semiconductor manufacturing system including the substrate holding apparatus 7B provides the same advantages as those of the semiconductor manufacturing system 1 according to the first embodiment of the present invention.

Fourth Embodiment

Figure 13:
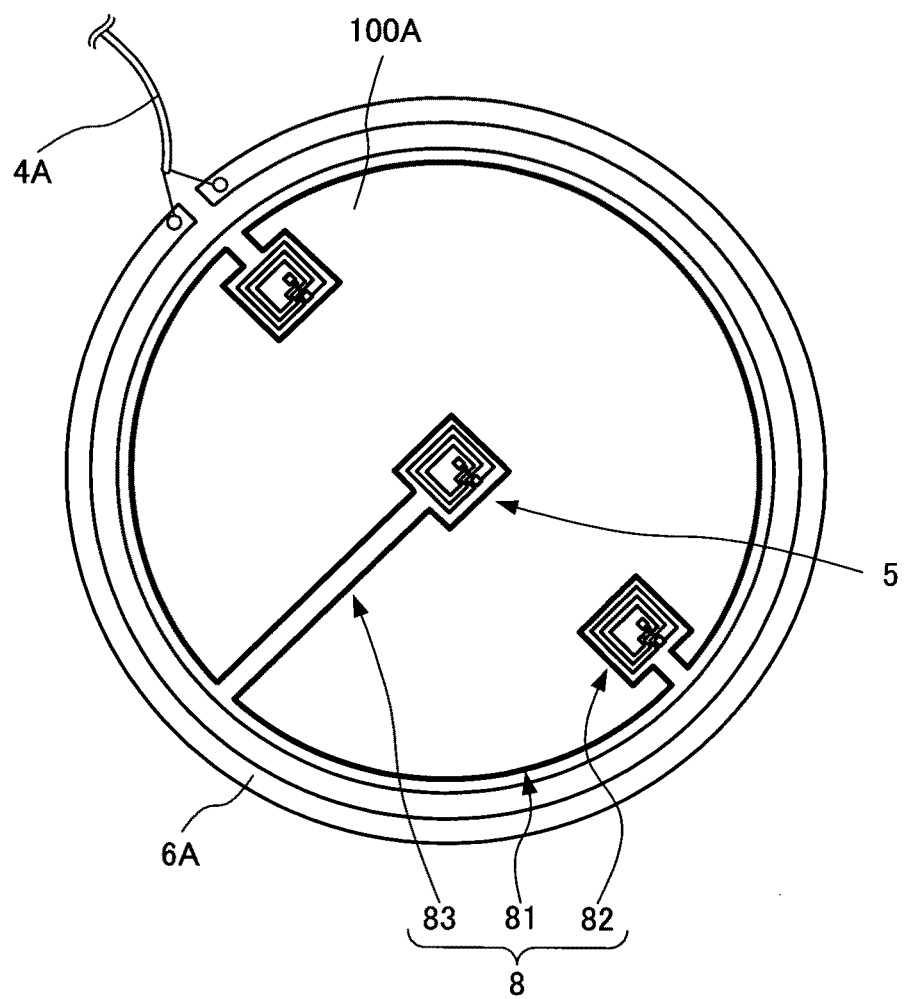
FIG. 13 is a front view of a wafer and a probe coil according to a fourth embodiment of the present invention.

FIG. 13 is a front view of a wafer 100A and a probe coil 6A according to a fourth embodiment of the present invention. The difference between the wafer 100A and the wafer 100 according to the first embodiment of the present invention shown in FIG. 2 is that the wafer 100A mounts a coil antenna 8, in addition to the resonators 5. Furthermore, the probe coil 6A is formed in a different shape from that of the probe coil 6 according to the first embodiment of the present invention shown in FIG. 7. The other configuration is the same as that of the first embodiment of the present invention, and accordingly, description thereof will be omitted.

The wafer 100A mounts three resonators 5 and the coil antenna 8. The coil antenna 8 has a configuration including a first partial coil antenna 81 which is provided along the edge of the wafer 100A, a second partial antenna 82 which is provided along the outer edge of each resonator 5, and a third partial coil antenna 83 which electrically connects the first partial coil antenna 81 and the second partial coil antenna 82. Accordingly, the inductor 54 included in each resonator 5 is magnetically coupled with the second partial coil antenna 82 provided along the outer edge of the resonator 5.

The single probe coil 6A is embedded within the quartz ring 72 such that it is arranged in the form of a ring along the inner edge of the quartz ring 72. The probe coil 6A is electrically connected to the analysis apparatus 3 via an RF cable 4A. With such an arrangement, the quartz ring 72 is arranged in the form of a ring along the edge of the wafer 100A. Accordingly, the probe coil 6A embedded within the quartz ring 72 is magnetically coupled with the first partial coil antenna 81 provided along the edge of the wafer 100A.

When a magnetic field, the direction of which changes according to the resonance frequency $f_0$, occurs around the inductor 54 included in the resonator 5 mounted on the wafer 100A, electromotive force, the direction of which changes according to the resonance frequency $f_0$ of the resonator 5, occurs at the second partial coil antenna 82 which magnetically couples with the resonator 5. The electromotive force thus generated is transmitted to the first partial coil antenna 81 via the third partial coil antenna 83, thereby generating a magnetic field around the first partial coil antenna 81, the direction of which changes according to the resonance frequency $f_0$ of the resonator 5. This generates electromotive force at the probe coil 6A magnetically coupled with the first partial coil antenna 81, the direction of which changes according to the resonance frequency $f_0$ of the resonator 5. Subsequently, the electromotive force thus generated at the probe coil 6A is supplied to the analysis apparatus 3.

A semiconductor manufacturing system including the wafer 100A and the probe coil 6A provides the same advantages as those of the semiconductor manufacturing system 1 according to the first embodiment of the present invention.

Fifth Embodiment

Figure 14:
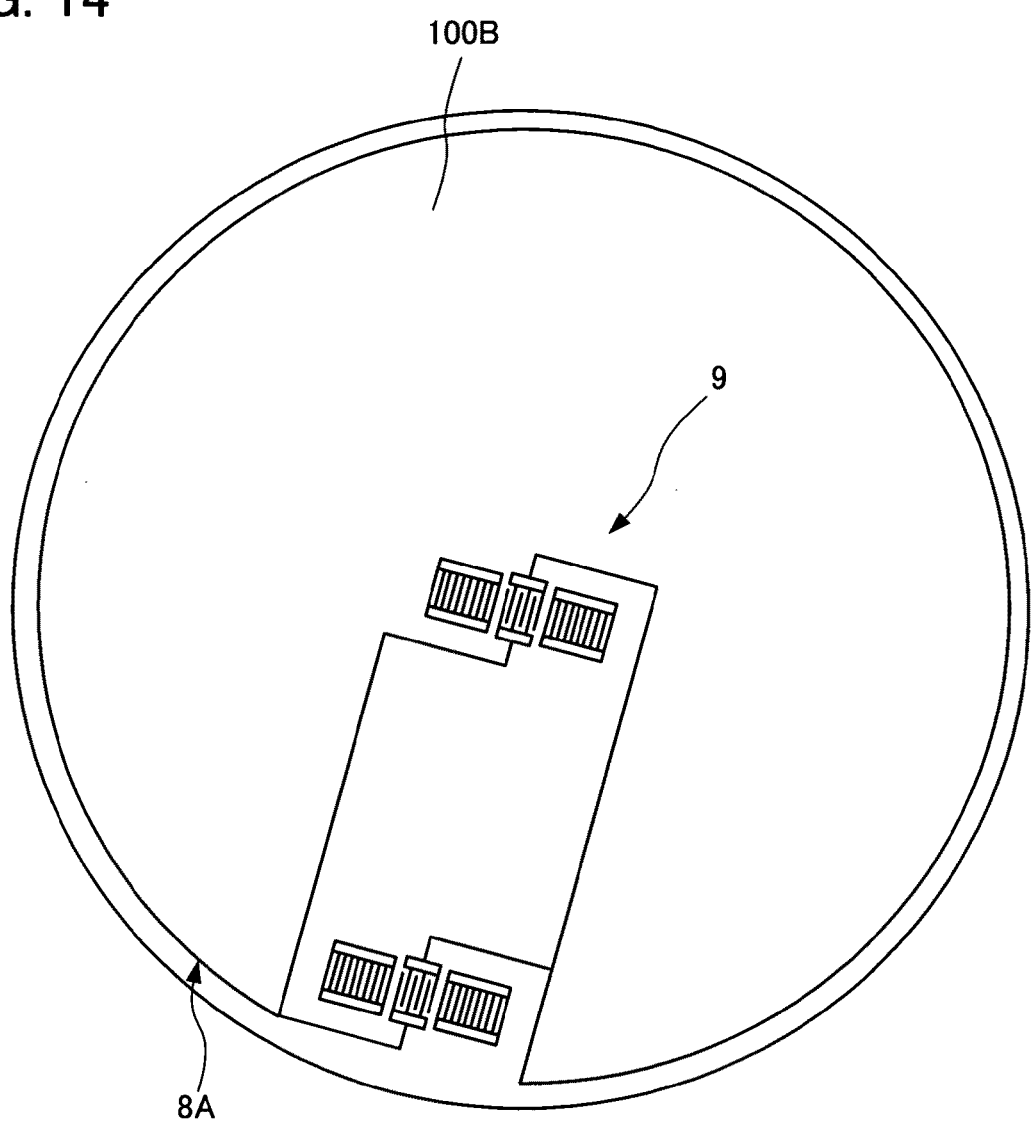
FIG. 14 is a front view of a wafer according to a fifth embodiment of the present invention.

FIG. 14 is a front view of a wafer 100B according to a fifth embodiment of the present invention. The difference between the wafer 100B and the wafer 100 according to the first embodiment of the present invention shown in FIG. 2 is that different components are mounted on the wafer. The other configuration is the same as that of the first embodiment of the present invention, and accordingly, description thereof will be omitted.

Figure 15:
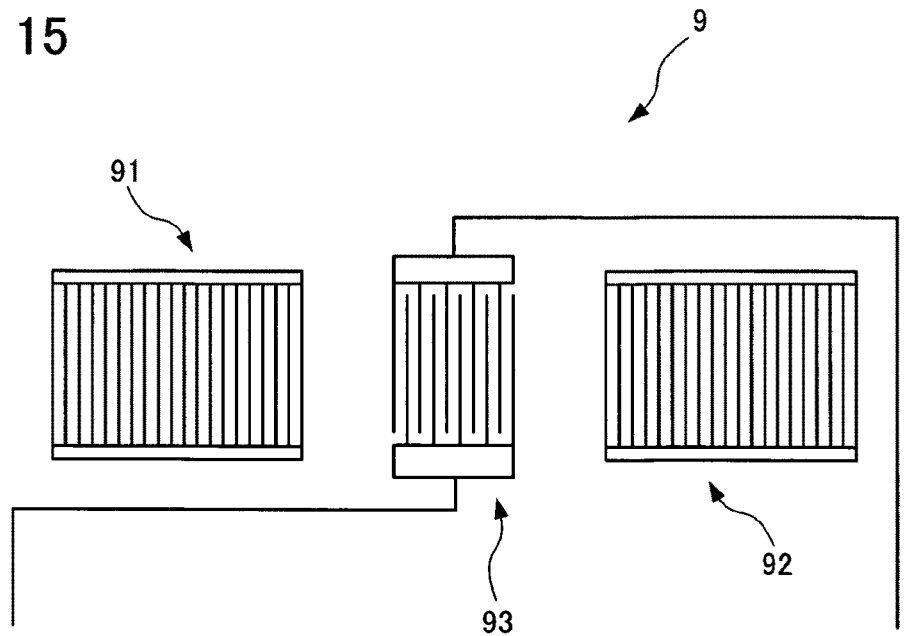
FIG. 15 is a front view of a SAW resonator mounted on the wafer.

The wafer 100B mounts two SAW resonators 9 and a coil antenna 8A. As shown in FIG. 15, each SAW resonator 9 includes two reflectors 91 and 92 and a comb-shaped electrode 93 provided between the two reflectors 91 and 92. The coil antenna 8A is provided along the edge of the wafer 100B, and is electrically connected to the two comb-shaped electrodes 93 included in the two SAW resonators 9.

Figure 16:
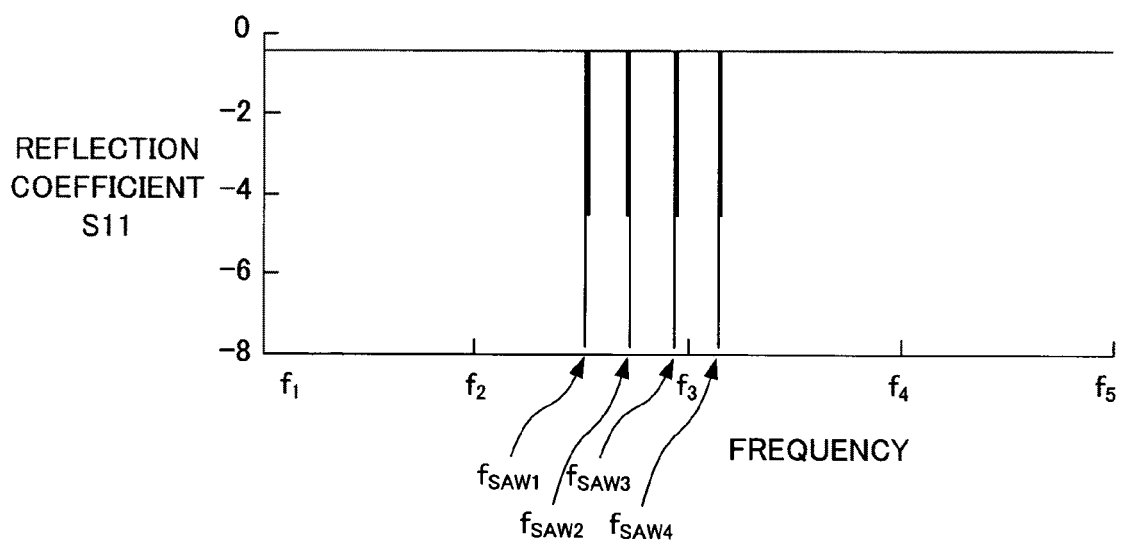
FIG. 16 is a diagram which shows the frequency properties of the SAW resonator.

FIG. 16 is a diagram which shows the frequency properties of the SAW resonator 9. In FIG. 16, the vertical axis represents the reflection coefficient S11, and the horizontal axis represents the frequency. FIG. 16 indicates that, when the frequency of the SAW resonator 9 matches $f_{SAW1}$, $f_{SAW2}$, $f_{SAW3}$, or $f_{SAW4}$, the reflection coefficient S11 is small. The resonance frequencies $f_{SAW1}$, $f_{SAW2}$, $f_{SAW3}$, and $f_{SAW4}$ change according to the temperature of the wafer 100 in the same way as with the frequency $f_0$ of the resonator 5 according to the first embodiment of the present invention.

A semiconductor manufacturing system including the above-described wafer 100B provides the same advantages as those of the semiconductor manufacturing system 1 according to the first embodiment of the present invention.

Description has been made above regarding the embodiments of the present invention with reference to the drawings. However, the specific configuration is by no means intended to be restricted to the above-described embodiments. Rather, various designs may be made without departing from the spirit and scope of the present invention, which are also encompassed in the scope of the present invention.

For example, in the above-described embodiments, the analysis target is the wafer temperature. However, the analysis target is not restricted to the wafer temperature. Rather, the analysis target could be desired information with respect to a substrate such as a wafer or a glass substrate for a display device. Examples of information with respect to the substrate include the amount of charge stored in the substrate, in addition to the temperature of the substrate.

Description has been made in the aforementioned embodiments regarding an arrangement in which the ceramic plate 712 formed of a ceramic material is provided as a base member of the electrostatic chuck 71. However, the present invention is not restricted to such an arrangement. Also, a base member formed of a dielectric material such as polyimide or the like may be provided.

Description has been made in the aforementioned embodiments regarding an arrangement in which the quartz ring 72 formed of quartz is provided in the shape of a ring along the edges of the ceramic plate 712, the adhesion layer 713, and a part of the base 714. However, the present invention is not restricted to such an arrangement. Also, a ring formed of an insulating material such a ceramic material may be provided.

Description has been made in the aforementioned embodiments regarding an arrangement in which each of the substrate holding apparatus 7, 7A, and 7B includes the electrostatic chuck 71 which holds the wafer 100 on the mounting surface 200 by electrostatic attraction. However, the present invention is not restricted to such an arrangement. Also, a mechanism for holding the wafer 100 may be provided using a substrate holding method that differs from the electrostatic attraction method, examples of which include a vacuum attraction method, mechanical holding method, etc.

Description has been made in the aforementioned first embodiment through fourth embodiment regarding an arrangement in which the inductor 54 is formed in a spiral shape. However, the present invention is not restricted to such an arrangement. Also, the inductor 54 may be formed in a helical shape, for example.

The present invention can be suitably applied to a substrate, a substrate holding apparatus, an analysis apparatus, a program, a detection system, a semiconductor device, a display apparatus, and a semiconductor manufacturing apparatus which are capable of detecting or analyzing the information such as the substrate temperature.

While preferred embodiments of the invention have been described and illustrated above, it should be understood that these are exemplary of the inventions and are not to be considered as limiting. Additions, omission, substitutions, and other modifications can be made without departing from the spirit or scope of the present invention. Accordingly, the invention is not to be considered as being limited by the foregoing description, and is only limited by the scope of the appended claims.

What is claimed is:

1. A substrate-sensor assembly including:
    a substrate for plasma etching; and
    at least one sensor unit mounted on a surface of the substrate for plasma etching, each of the at least one sensor unit including a resonator defining an LC tank circuit including:
        a coil wound at least once arranged on a surface of the sensor unit or embedded within and near the surface of the sensor unit,
        a first capacitor connected to a first end of the coil, and
        a second capacitor connected to a second end of the coil,
        wherein the LC tank circuit is adapted and configured to produce an electric current according to a resonant frequency of the resonator that corresponds to the amount of charge stored in the substrate that flows through the coil.

2. A substrate-sensor assembly according to claim 1, wherein the coil is formed in a spiral shape or a helical shape.

3. A substrate-sensor assembly according to claim 1, wherein the direction of the electric current that flows through the coil according to the amount of charge stored in the substrate changes according to the resonance frequency of the resonator.

4. A substrate holding apparatus which holds a substrate-sensor assembly according to claim 1, including a probe coil which is magnetically coupled with the coil,
    wherein, when a magnetic field occurs around the coil due to the electric current flowing through the coil, electromotive force occurs at the probe coil according to the magnitude of the magnetic field.

5. A substrate holding apparatus which holds a substrate-sensor assembly according to claim 1,
    wherein the direction of the electric current that flows through the coil according to the amount of charge stored in the substrate changes according to the resonance frequency of the resonator,
    and wherein the substrate holding apparatus includes a probe coil which is magnetically coupled with the coil,
    and wherein, when a magnetic field, the direction of which changes according to the resonance frequency of the resonator, occurs around the coil due to electric current flowing through the coil, the direction of which changes according to the resonance frequency of the resonator, electromotive force, which corresponds to the magnitude of the magnetic field and the direction of which changes according to the resonance frequency of the resonator, occurs at the probe coil.

6. A substrate holding apparatus which holds a substrate-sensor assembly according to claim 1, including a probe coil arranged in a position selected from among positions around the coil, directly above the coil, and directly below the coil,
    wherein, when a magnetic field occurs around the coil due to the electric current flowing through the coil, electromotive force occurs at the probe coil according to the magnitude of the magnetic field.

7. An analysis apparatus which analyzes the amount of charge stored in the substrate-sensor assembly according to claim 1, wherein the substrate-sensor assembly is held by a substrate holding apparatus including a probe coil which is magnetically coupled with the coil,
    and wherein, when a magnetic field occurs around the coil due to the electric current flowing through the coil, electromotive force occurs at the probe coil according to the magnitude of the magnetic field, and wherein the analysis apparatus analyzes the amount of charge stored in the substrate based upon the electromotive force that occurs at the probe coil.

8. An analysis apparatus including:
a storage unit which stores correspondence information which represents the relation between the resonance frequency of the resonator included in the sensor unit provided to the substrate-sensor assembly according to claim 1 and the amount of charge stored in the resonator; and an amount of charge deriving unit which derives the amount of charge stored in the resonator based upon the correspondence information and the frequency of changes in the direction of the electromotive force that occurs at a probe coil included in a substrate holding apparatus which holds the substrate, and wherein the direction of the electric current that flows through the coil according to the amount of charge stored in the substrate changes according to the resonance frequency of the resonator, and wherein the probe coil is magnetically coupled with the coil, and wherein, when a magnetic field, the direction of which changes according to the resonance frequency of the resonator, occurs around the coil due to electric current flowing through the coil, the direction of which changes according to the resonance frequency of the resonator, electromotive force, which corresponds to the magnitude of the magnetic field and the direction of which changes according to the resonance frequency of the resonator, occurs at the probe coil.

9. A program which instructs a computer to execute analysis of the amount of charge stored in the substrate based upon the electromotive force that occurs at a probe coil included in a substrate holding apparatus which holds a substrate-sensor assembly according to claim 1, wherein the probe coil is magnetically coupled with the coil, and wherein, when a magnetic field occurs around the coil due to the electric current flowing through the coil, electromotive force occurs at the probe coil according to the magnitude of the magnetic field.

10. A detection system including:
a substrate-sensor assembly according to claim 1;
a substrate holding apparatus which holds the substrate-sensor assembly; and an analysis apparatus which analyzes the amount of charge stored in the substrate, wherein the direction of the electric current that flows through the coil according to the amount of charge stored in the substrate changes according to the resonance frequency of the resonator, and wherein the substrate holding apparatus includes a probe coil which is magnetically coupled with the coil, and wherein, when a magnetic field, the direction of which changes according to the resonance frequency of the resonator, occurs around the coil due to electric current flowing through the coil, the direction of which changes according to the resonance frequency of the resonator, electromotive force, which corresponds to the magnitude of the magnetic field and the direction of which changes according to the resonance frequency of the resonator, occurs at the probe coil, and wherein the analysis apparatus includes:
a storage unit which stores correspondence information which represents the relation between the resonance frequency of the resonator and the amount of charge stored in the resonator, and an amount of charge deriving unit which derives the amount of charge stored in the resonator based upon the correspondence information and the frequency of changes in the direction of the electromotive force that occurs at the probe coil.

11. A semiconductor device including a substrate-sensor assembly according to claim 1.

12. The substrate-sensor assembly according to claim 1, wherein:
the number of sensor units of the at least one sensor unit is two or more, and
the number of probe coils of the at least one probe coil is two or more.

13. The substrate-sensor assembly according to claim 1, wherein:
the first capacitor is directly connected to the first end of the coil, and
the second capacitor is directly connected to the second end of the coil.

14. The substrate-sensor assembly according to claim 1, wherein a mounting surface is interposed between each of the at least one sensor unit and each of the at least one probe coil, respectively.

* * * * *